US008008959B2

(12) United States Patent
Sekine et al.

(10) Patent No.: US 8,008,959 B2
(45) Date of Patent: Aug. 30, 2011

(54) FLIP-FLOP CIRCUIT THAT LATCHES INPUTTED DATA

(75) Inventors: Satoru Sekine, Gifu (JP); Shinji Furuichi, Maibara (JP)

(73) Assignee: Sanyo Electric Co., Ltd., Osaka (JP)

( * ) Notice: Subject to any disclaimer, the term of this patent is extended or adjusted under 35 U.S.C. 154(b) by 112 days.

(21) Appl. No.: 12/371,094

(22) Filed: Feb. 13, 2009

(65) Prior Publication Data

US 2009/0231008 A1 Sep. 17, 2009

(30) Foreign Application Priority Data

Mar. 17, 2008 (JP) ................................ 2008-068168

(51) Int. Cl.
*H03K 3/289* (2006.01)

(52) U.S. Cl. ....................................... 327/202; 327/203

(58) Field of Classification Search .................. 327/161, 327/185, 199–203, 208–212, 214, 218
See application file for complete search history.

(56) References Cited

U.S. PATENT DOCUMENTS 6,087,872 A * 7/2000 Partovi et al. ................ 327/201
2008/0030250 A1 * 2/2008 Furuichi et al. ............... 327/212

OTHER PUBLICATIONS

Kwon, Young-Su et al., "A new single-clock flip-flop for half-swing clocking," Proc. of ASP-DAC 1999.

* cited by examiner

*Primary Examiner* — Lincoln Donovan
*Assistant Examiner* — Diana J Cheng
(74) *Attorney, Agent, or Firm* — McDermott Will & Emery LLP

(57) ABSTRACT

A flip-flop circuit operates by a first clock signal whose amplitude is smaller than that of input data D. A pair of transistors receive the input data D and the reversed input data *D, respectively, to latch the input data D. An activation circuit activates the pair of transistors in a conduction state. A control circuit receives the first clock signal and sets the activation circuit to a conduction state for a predetermined time period starting from an edge timing of the received first clock signal. The control circuit increases the amplitude of the first clock signal and sets the activation circuit in a conduction state by using a second clock signal which is the first clock signal with the increased amplitude.

9 Claims, 13 Drawing Sheets

100a

FLIP-FLOP CIRCUIT THAT LATCHES INPUTTED DATA

CROSS-REFERENCE TO RELATED APPLICATIONS

This application is based upon and claims the benefit of priority from the prior Japanese Patent Application No. 2008-068168, filed on Mar. 17, 2008, the entire contents of which are incorporated herein by reference.

BACKGROUND OF THE INVENTION

1. Field of the Invention

The present invention relates to a flip-flop circuit that latches inputted data.

2. Description of the Related Art

A reduction in power consumption is required for an LSI (Large Scale Integration) mounted on electronic equipment. In particular, the reduction in power consumption is strongly required for LSIs mounted on battery-driven mobile devices for the purpose of securing the extended battery life. A large portion of electric power consumed within the LSI is consumed as power for the charging and discharging of gate capacitances used for turning on and off gates of transistors by clock signals. Thus, the reduction in power consumed by the charging and discharging will be effective in the reduction of power consumed by LSIs.

The aforementioned power consumed by the charging and discharging by the clock signals is proportional to the square of power supply voltage. Thus, the reduction in the amplitude of clock signal will be effective in the reduction of power consumed by the charging and discharging.

FIG. 1 shows a flip-flop circuit that operates by a low-amplitude clock. Referring to FIG. 1, the amplitude of a clock signal clk and its inverted clock signal clkb is reduced to one half (Vcc/2) of a power supply voltage Vcc.

When a gate of a transistor is to be turned on and off using a low-amplitude signal, the current drive capacity of the transistor deteriorates and the transistor operates slower as compared with a case where the transistor is turned on and off using the full-amplitude signal. The size of a transistor, more specifically the gate width thereof, needs to be increased in order to make the operating speed of the transistor faster by using the low-amplitude signal. However, such a transistor requires a large electric power for the charging and discharging of gate capacitance. Thus, if the aforementioned power consumed by the charging and discharging is to be suppressed and reduced using low-amplitude clocks, the size of transistor must be increased or slower operating speed thereof must be tolerated.

SUMMARY OF THE INVENTION

A flip-flop circuit according to one embodiment of the present invention is a flip-flop circuit operated by a first clock signal whose amplitude is smaller than that of input data, and the flip-flop circuit comprises: a pair of transistors which receive the input data and reversed input data thereof, respectively, to latch the input data; an activation circuit which activates the pair of transistors in a conduction state; and a control circuit which receives the first clock signal and sets the activation circuit to a conduction state for a predetermined time period starting from an edge timing of the first clock signal. The control circuit increases the amplitude of the first clock signal and sets the activation circuit in a conduction state by using a second clock signal which is the first clock signal with the increased amplitude.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

Figure 1:
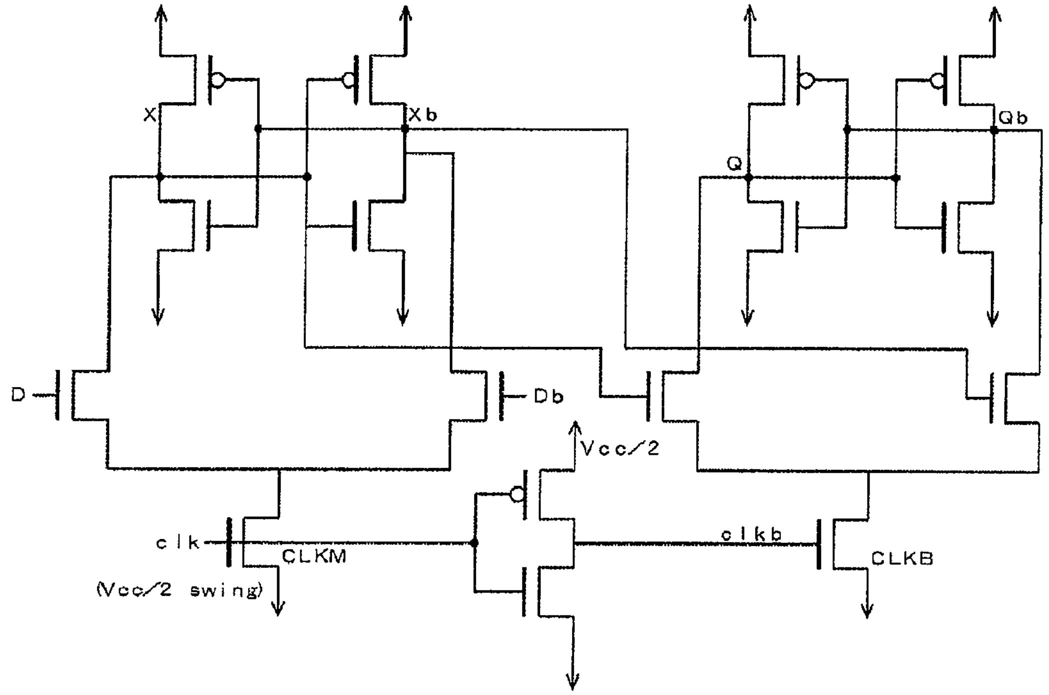
FIG. 1 shows a flip-flop circuit, which operates by a low-amplitude clock, according to a conventional art.

The invention will now be described by reference to the preferred embodiments. This does not intend to limit the scope of the present invention, but to exemplify the invention.

The present invention is described based on the following embodiments with reference to drawings. The same or equivalent components, members and processings shown in Figures are given the identical reference numerals and the repeated description thereof will be omitted as appropriate. The following embodiments do not intend to limit the scope of the present invention but exemplify the invention, and all of the features and the combinations thereof described in the embodiments are not necessarily essential to the invention.

First Embodiment

Figure 2:
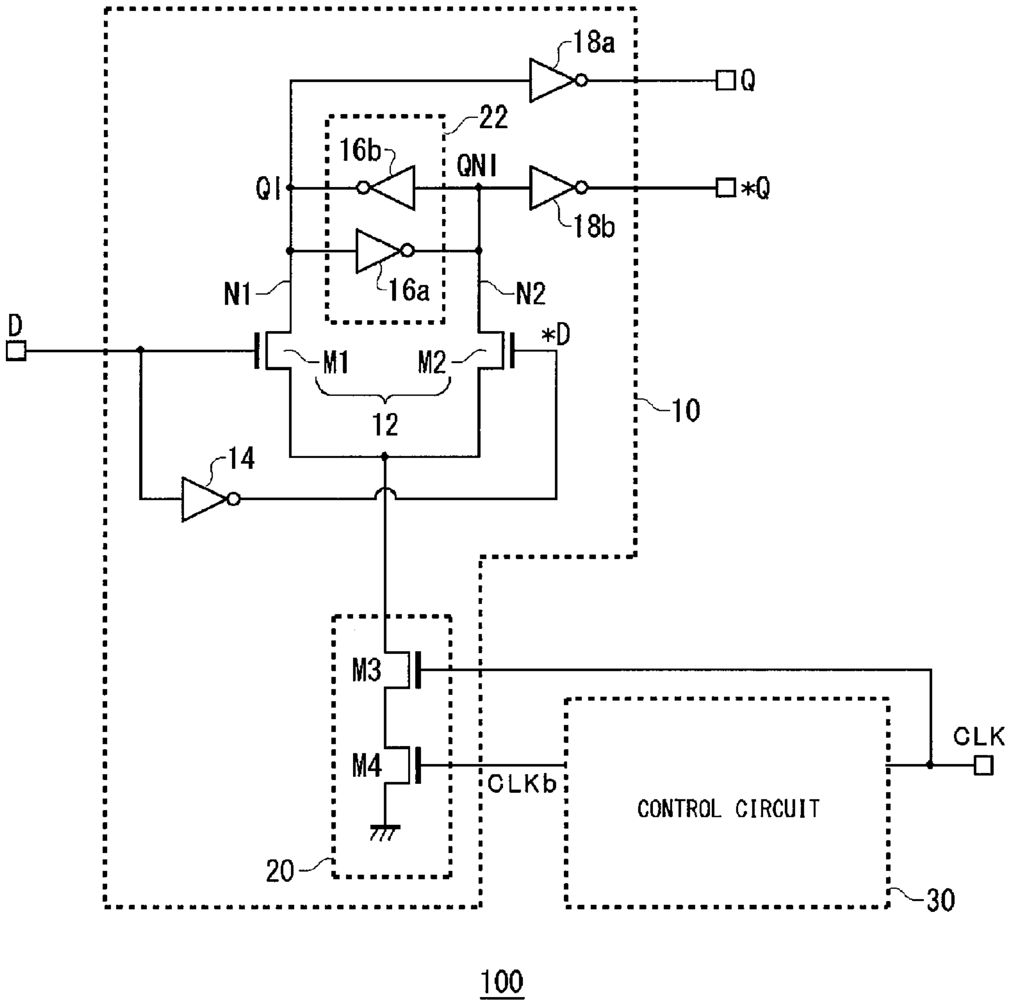
FIG. 2 is a circuit diagram showing a structure of a flip-flop circuit according to a first embodiment of the present invention.

FIG. 2 is a circuit diagram showing a structure of a flip-flop circuit 100 according to a first embodiment of the present invention. The flip-flop circuit 100 operates by a first clock signal CLK whose amplitude is smaller than that of input data D. The flip-flop circuit 100 latches the input data D based on the first clock signal CLK and then outputs output data Q and inverted output data *Q. Note that the inversion of a given logical signal, namely its complementary level, is denoted by "*".

The flip-flop circuit 100 includes a latch circuit 10 and a control circuit 30.

The latch circuit 10, which is constituted by SRAM-type components, is a circuit that holds the input data D. The latch circuit 10 includes a transistor pair 12, an input inverter 14, a first internal inverter 16*a*, a second internal inverter 16*b*, a first output inverter 18*a*, a second output inverter 18*b*, and an activation circuit 20.

Transistors in the transistor pair 12 receive the input data D and the inverted input data *D, respectively, to latch the input data D. The transistor pair 12 is constituted by a first input transistor M1 and a second input transistor M2, which are N-channel MOSFETs. A source terminal of the first input transistor M1 and a source terminal of the second input transistor M2 are connected in common to the activation circuit 20. A gate terminal of the first input transistor M1 receives input data D. A gate terminal of the second input transistor M2 receives the inverted input data D* generated by inverting the input data D by the input inverter 14.

In an active state, the first input transistor M1 and the second input transistor M2 are turned on and off, in a complementary manner, according to the input data D. A state where the transistor pair 12 is active is a state where a path leading from a first fixed potential (first power supply potential VDDH in the present embodiment) to a second fixed potential (ground potential GND in the present embodiment) is capable of being electrically conducted. Hereinafter, a drain terminal of the first input transistor M1 and a drain terminal of the second input transistor M2 will be denoted by a first internal node N1 and a second internal node N2, respectively, and the data appearing at the nodes N1 and N2 will be denoted by internal data QI and inverted internal data QNI, respectively.

The first internal inverter 16*a* and the second internal inverter 16*b* are connected in parallel between the drain terminal of the first input transistor M1 and the drain terminal of the second input transistor M2. That is, they are connected in parallel between the first internal node N1 and the second internal node N2. The first internal inverter 16*a* and the second internal inverter 16*b* are connected in opposite direction to each other. The first internal inverter 16*a* and the second internal inverter 16*b* constitute a data storage circuit 22 and function as memory for storing the internal data QI of the first internal node N1 and the inverted internal data QNI of the second internal node N2 at a complementary level.

The first output inverter 18*a* inverts the internal data QI of the first internal node N1 and then outputs it to the outside as output data Q. The second output inverter 18*b* inverts the inverted internal data QNI of the second internal node N2 and then outputs it to the outside as inverted output data *Q.

In a conduction state, the activation circuit 20 activates the transistor pair 12. The activation circuit 20 includes a first activation transistor M3 and a second activation transistor M4 which are cascade-connected to each other. Also, the first activation transistor M3 and the second activation transistor M4 are provided between the source terminal of the transistor pair 12 and the second fixed potential.

The first activation transistor M3 and the second activation transistor M4 are each an N-channel MOSFET. A drain terminal of the first activation transistor M3 is connected to the common source terminal of the first input transistor M1 and the second input transistor M2 that constitute the transistor pair 12. A source terminal of the first activation transistor M3 and a drain terminal of the second activation transistor M4 are connected to each other. A source terminal of the second activation transistor M4 is connected to the second fixed potential.

As both the first activation transistor M3 and the second activation transistor M4 turn on, the activation circuit 20 becomes conductive so as to activate the transistor pair 12. As at least one of the first activation transistor M3 and the second activation transistor M4 turns off, the activation circuit 20 becomes nonconductive so as to inactivate the transistor pair 12. A state where the transistor pair 12 is being active corresponds to a time period during which the input data D are being set in the latch circuit 10. In this patent specification, this state will be called "clock window period".

The control circuit 30 receives the first clock signal CLK and sets the activation circuit 20 to a conduction state for a predetermined period starting from an edge timing (positive edge in the present embodiment) of said first clock signal CLK. In so doing, according to the first embodiment, the control circuit 30 generates a second clock signal CLKb by inverting the first clock signal CLK whose amplitude has been increased. The activation circuit 20 is set to a conduction state using the second clock signal CLKb. The control circuit 30 may increase the amplitude of the second clock signal CLKb to that of the input data D.

As described above, the control circuit 30 has a function as a clock buffer that receives the first clock signal CLK, a function as an inverter that inverts the first clock signal CLK, and a function as a level shifter that increases the amplitude of the first clock signal CLK.

As the first clock signal CLK is inputted to the gate terminal of the first activation transistor M3, the first activation transistor M3 is turned on. Then the control circuit 30 inputs the second clock signal CLKb to the gate terminal of the second activation transistor M4 so as to turn off the second activation transistor M4. A detailed circuit configuration of the control circuit 30 will be discussed later.

Figure 3:
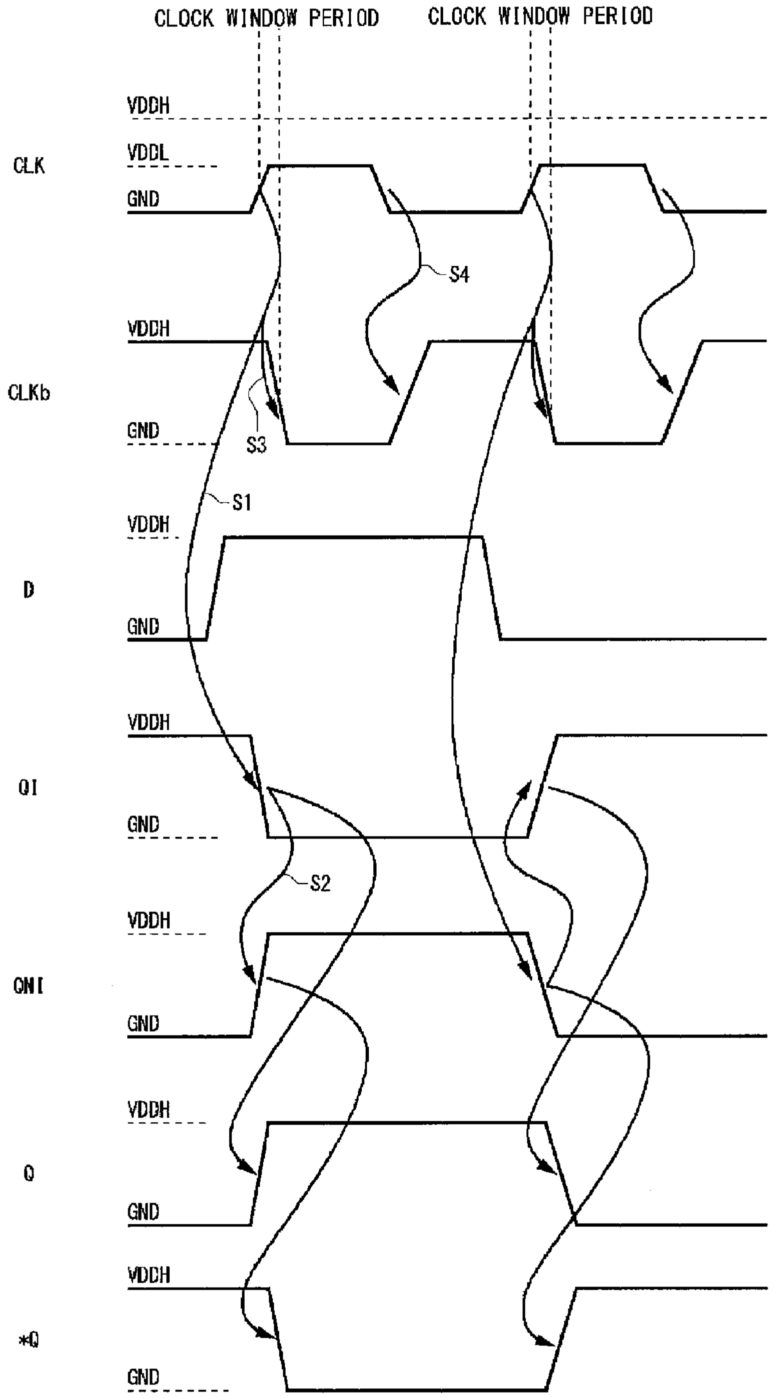
FIG. 3 is a timing chart to explain an operation of a flip-flop circuit according to a first embodiment of the present invention.

FIG. 3 is a timing chart to explain an operation of the flip-flop circuit 100 according to the first embodiment of the present invention.

Presupposed herein are that the high-level-side first fixed potentials of the input data D, the internal data QI, the inverted internal data QNI, the output data Q, the inverted output data *Q and the second clock signal CLKb are set to the first power supply potential VDDH. Also, the low-level-side second fixed potentials of the input data D, the internal data QI, the inverted internal data QNI, the output data Q, the inverted output data *Q, the first clock signal CLK and the second clock signal CLKb are set to the ground potential GND. Also, the high-level-side third fixed potential of the first clock signal CLK is set to a second power supply potential VDDL. Assume that the second power supply potential VDDL is one half of the first power supply potential VDDH.

As the first clock signal CLK exceeds a threshold voltage of the first activation transistor M3 during the time when the first clock signal CLK inputted to the gate terminal of the first activation transistor M3 rises from a low level to a high level, the current will start flowing through the first activation transistor M3. At this time the second activation transistor M4 is conductive, so that the transistor pair 12 is activated and the internal data QI is inverted (S1). Since the internal data QI has been inverted, the inverted internal data QNI is also inverted (S2). The inversion of the internal data QI causes the output data Q to be inverted. The inversion of the inverted internal data QNI results in the inversion of the inverted output data *Q.

In response to the transition of the first clock signal CLK from a low level to a high level, the transition of the second clock signal CLKb from a high level to a low level starts (S3). When the second clock signal CLKb falls below a threshold voltage of the second activation transistor M4, the current flowing through the second activation transistor M4 stops, which in turn sets the transistor pair 12 inactive.

In response to the transition of the first clock signal CLK from a high level to a low level, the transition of the second clock signal CLKb from a low level to a high level starts (S4). The above transitions do not affect the state of the transistor pair 12. That is, the transistor pair 12 remains inactive.

The clock window period is a time period elapsed from when the first activation transistor M3 turns on until the second activation transistor M4 turns off. During a clock window period, the latch circuit 10 takes in the input data D. In a period other than the clock window periods, the latch circuit 10 holds the data taken in during a previous clock window period even though the level of the input data D varies. That is, in a period other than the clock window periods, the levels of the output data Q and the inverted output data *Q remain unchanged even though the level of the input data D varies. The structure of the control circuit 30 accounts for a reason why the transition time of a rising edge of the second clock signal CLKb differs from the transition time of a falling edge thereof.

A detailed description is hereinbelow given of circuit configuration of the control circuit 30.

Figure 4:
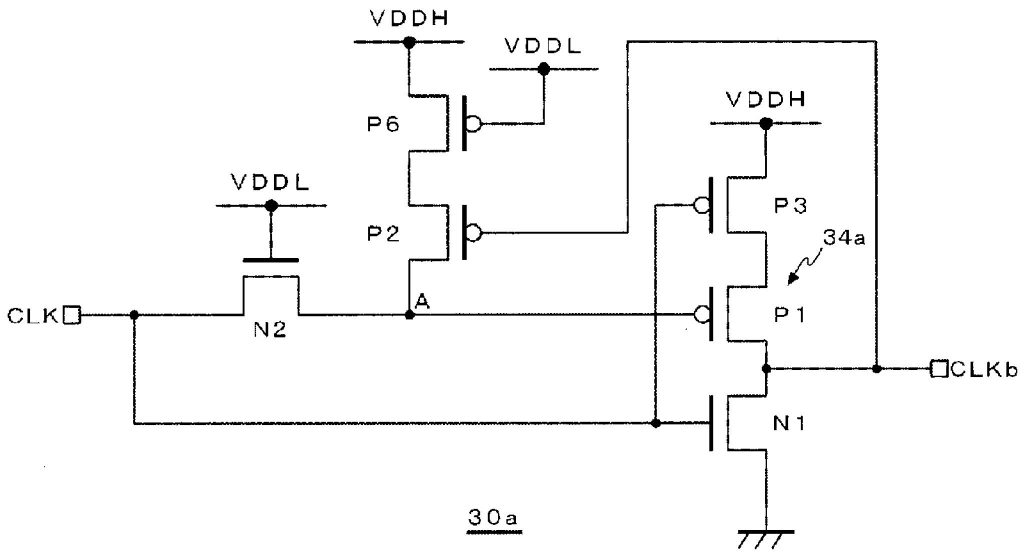
FIG. 4 shows a first exemplary structure of a control circuit according to a first embodiment of the present invention.

FIG. 4 shows a first exemplary structure of a control circuit 30*a* according to the first embodiment of the present invention.

The control circuit 30*a* according to the first exemplary structure of the first embodiment includes an inverter 34*a*, a second P-channel transistor P2, a second N-channel transistor N2, a third P-channel transistor P3, and a sixth P-channel transistor P6.

The inverter 34*a* includes a first P-channel transistor P1 and a first N-channel transistor N1 which are provided between the first fixed potential VDDH and the second fixed potential GND. A source terminal of the first P-channel transistor P1 is connected to the first fixed potential VDDH via the third P-channel transistor P3, and a gate terminal thereof receives the voltage of node A. A source terminal of the first N-channel transistor N1 is connected to the second fixed potential GND, and a gate thereof receives the first clock signal CLK. A drain terminal of the first P-channel transistor P1 and a drain terminal of the first N-channel transistor N1 are connected together. The potential of this connecting point is an output of the inverter 34, namely the second clock signal CLKb.

The third P-channel transistor P3 is provided between the first fixed potential VDDH and the inverter 34. A source terminal of the third P-channel transistor P3 is connected to the first fixed potential VDDH; a gate terminal thereof receives the first clock signal CLK; and a drain terminal thereof is connected to the source terminal of the first P-channel transistor P1.

A source terminal of the second P-channel transistor P2 is connected directly or indirectly to the first fixed potential VDDH. Here, the source terminal thereof is connected to the first fixed potential VDDH by way of the sixth P-channel transistor P6. A gate terminal of the second P-channel transistor P2 receives an output of the inverter 34*a*. A drain terminal of the second P-channel transistor P2 is connected to the node A, namely the gate terminal of the first P-channel transistor P1, and supplies voltage to the gate terminal of the first P-channel transistor P1.

A source terminal of the sixth P-channel transistor P6 is connected to the first fixed potential VDDH; a gate terminal thereof is connected to the third fixed potential VDDL; and a drain terminal thereof is connected to the source terminal of the second P-channel transistor P2. The sixth P-channel P6 operates as a resistor used to suppress the through current. Note that any other element may be used as long as it behaves as a resistor. Also, the second fixed potential GND, instead of the third fixed potential VDDL, may be connected to the gate terminal of the sixth P-channel transistor P6. In such a case, the function of suppressing the through current weakens but the linearity of resistance characteristics improves, so that an adverse effect of characteristic variations of the sixth P-channel transistor P6 on the entire control circuit 30*a* can be suppressed. Here, the characteristic variations of the sixth P-channel transistor P6 include variations in threshold potential, for instance.

The second N-channel transistor N2 is provided between an input terminal, used to take in the first clock signal CLK, and the gate terminal of the first P-channel transistor P1. A source terminal of the second N-channel transistor N2 is connected to the input terminal; a gate terminal thereof is connected to the third fixed potential VDDL; and a drain terminal thereof is connected to the node A, namely the gate terminal of the first P-channel transistor P1. The second N-channel transistor N2 turns off when the first clock signal CLK goes high. This prevents the electric charge at the node A from flowing back to an input terminal side.

Figure 5:
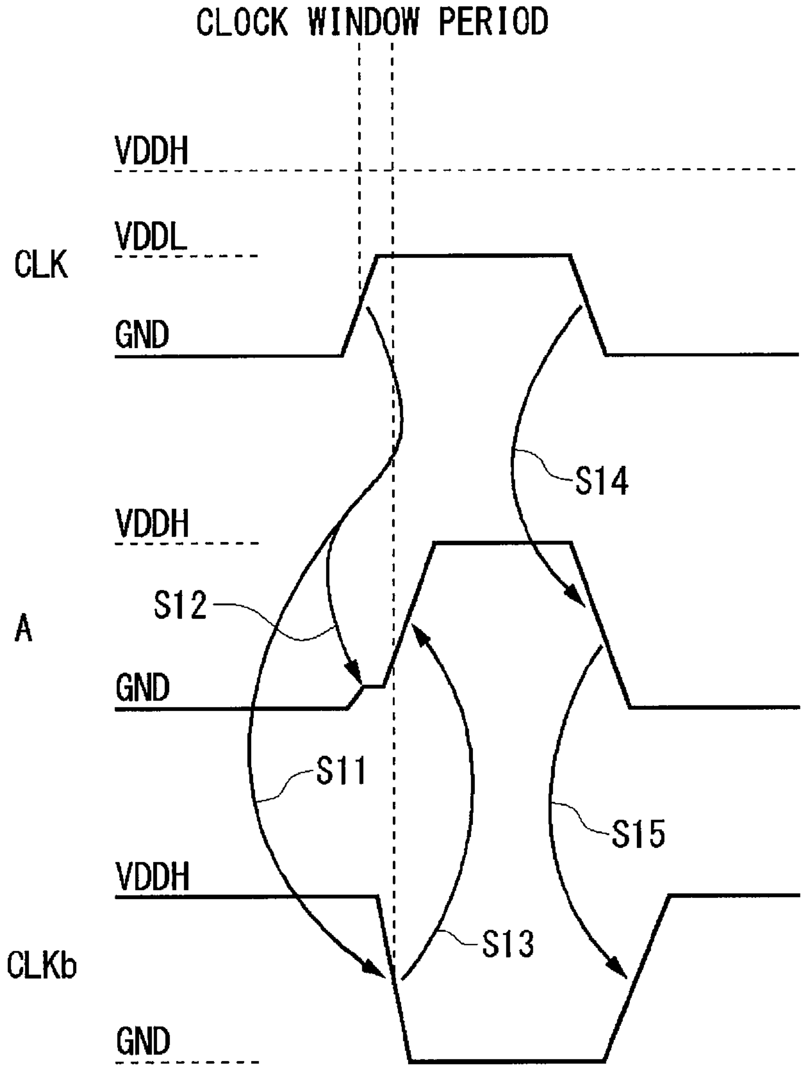
FIG. 5 is a timing chart to explain an operation of a control circuit according to a first exemplary structure of a first embodiment.

FIG. 5 is a timing chart to explain an operation of the control circuit 30*a* according to a first exemplary structure of the first embodiment.

As the first clock signal CLK starts transiting from a low level to a high level, the first N-channel transistor N1 starts delivering the current and then the third P-channel transistor P3 and the second N-channel transistor N2 start regulating the current. As a result, the second clock signal CLKb starts transiting from a high level to a low level (S11). At this time, the second N-channel transistor N2 regulates the current. Therefore, only a small voltage of up to {(third fixed potential VDDL) minus (−) (threshold potential Vth of second N-channel transistor N2)} is applied to the node A at the outset of this transition (S12).

Then as the transition of the second clock signal CLKb proceeds from a high level to a low level, the second P-channel transistor P2, which receives the second clock signal CLKb at the gate terminal, starts delivering the current with the result that the potential of the node A rises (S13).

On the other hand, as the first clock signal CLK starts transiting from a high level to a low level, the second N-channel transistor N2 conducts and the potential at the node A drops (S14). Then the first P-channel transistor P1 starts delivering the current due to the drop in the potential at the node A, thus raising the potential of the second clock signal CLKb (S15).

Figure 6:
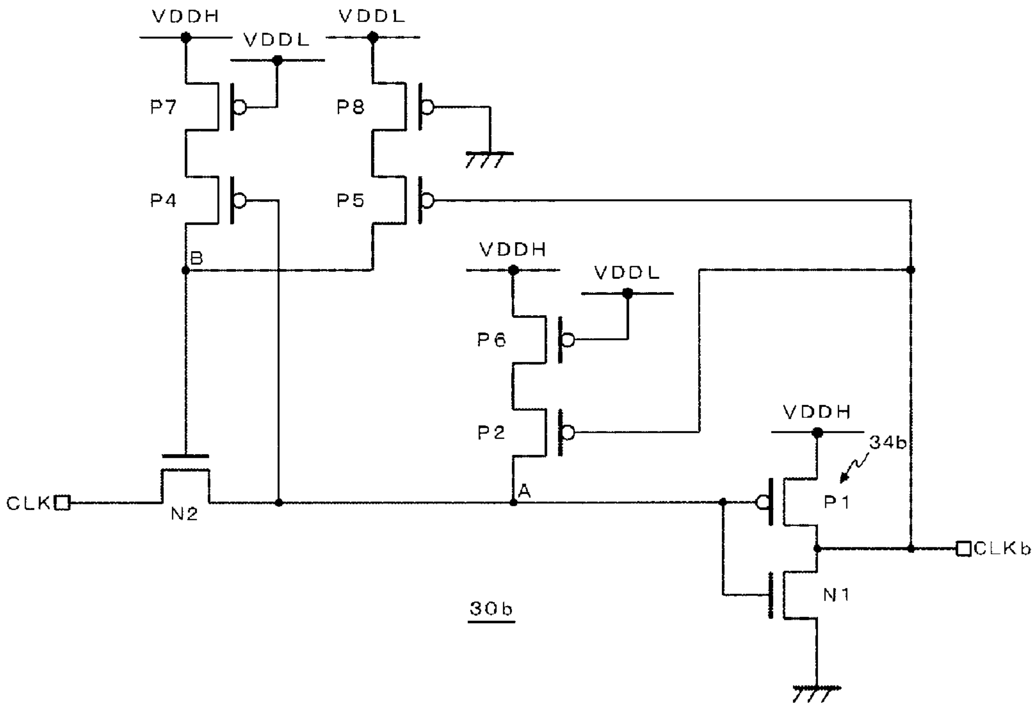
FIG. 6 shows a second exemplary structure of a control circuit according to a first embodiment of the present invention.

FIG. 6 shows a second exemplary structure of the control circuit 30*b* according to the first embodiment.

A control circuit 30*b* according to the second exemplary structure of the first embodiment includes an inverter 34*b*, a second P-channel transistor P2, a second N-channel transistor N2, a fourth P-channel transistor P4, a fifth P-channel transistor P5, a sixth P-channel transistor P6, a seventh P-channel transistor P7, and an eighth P-channel transistor P8

As compared with the control circuit 30*a* according to the first exemplary structure of the first embodiment, the third P-channel transistor P3 is removed and the fourth P-channel transistor P4, the fifth P-channel transistor P5, the seventh P-channel transistor P7 and the eighth P-channel transistor P8 are added. Also, the terminals to which the gate terminal of the first N-channel transistor N1, the source terminal of the first P-channel transistor P1 and the gate terminal of the second N-channel transistor N2 are connected differ from those in the first exemplary structure of the first embodiment.

The second exemplary structure further differs from the first exemplary structure in that the source terminal of the first P-channel transistor P1 is directly connected to the first fixed potential VDDH and the gate terminal of the first N-channel transistor N1 also receives the voltage of the node A the same way as the gate terminal of the first P-channel transistor P1 does.

The configuration of the second P-channel transistor P2 and the sixth P-channel transistor P6 is the same as that of the first exemplary structure.

A source terminal of the fourth P-channel transistor P4 receives the first fixed potential VDDH directly or indirectly. Here, the source terminal thereof is connected to the first fixed potential VDDH by way of the seventh P-channel transistor P7. A gate terminal of the fourth P-channel transistor P4 receives the voltage of node A, namely the drain terminal of the second P-channel transistor P2. A drain terminal of the fourth P-channel transistor P4, which is connected to the gate terminal of the second N-channel transistor N2, supplies the voltage to the gate terminal thereof.

A source terminal of the seventh P-channel transistor P7 is connected to the first fixed potential VDDH; a gate terminal thereof is connected to the third fixed potential VDDL; and a drain terminal thereof is connected to the source terminal of the fourth P-channel transistor P4. The seventh P-channel P7 operates as a resistor used to suppress the through current.

A source terminal of the fifth P-channel transistor P5 receives the third fixed potential VDDL directly or indirectly. Here, the source terminal thereof is connected to the third fixed potential VDDL by way of the eighth P-channel transistor P8. A gate terminal of the fifth P-channel transistor P5 receives an output of the inverter 34*b*. A drain terminal of the fifth P-channel transistor P5, which is connected to the gate terminal of the second N-channel transistor N2, supplies the voltage to the gate terminal thereof.

A source terminal of the eighth P-channel transistor P8 is connected to the third fixed potential VDDL; a gate terminal thereof is connected to the second fixed potential GND; and a drain terminal thereof is connected to the source terminal of the fifth P-channel transistor P5. The eighth P-channel transistor P8 operates as a resistor used to suppress the through current.

The second N-channel transistor N2 is provided between the input terminal of the first clock signal CLK and the input terminal of the inverter 34*b*. The source terminal of the second N-channel transistor N2 is connected to the input terminal used to take in the first clock signal CLK; the gate terminal thereof is connected to the drain terminals of the fourth P-channel transistor P4 and the fifth P-channel transistor P5; and the drain terminal thereof is connected to the node A.

Figure 7:
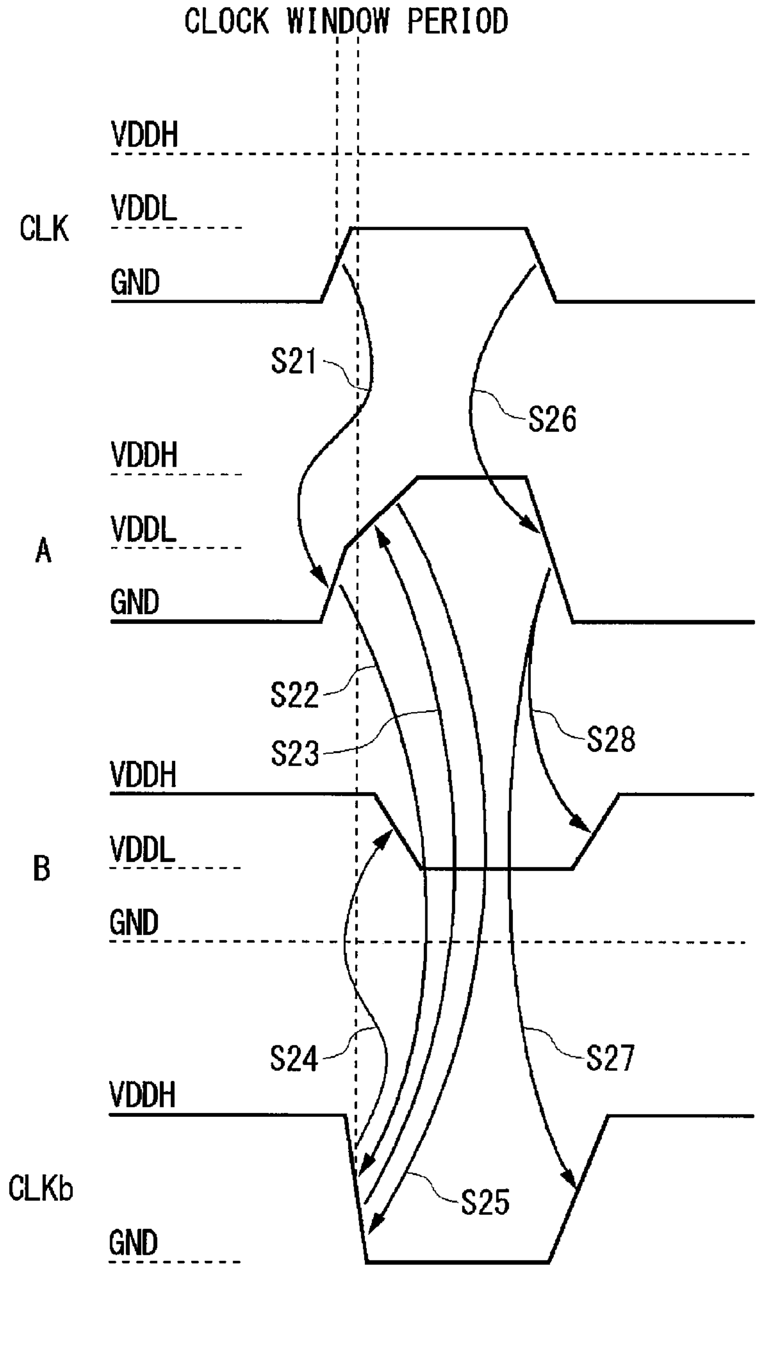
FIG. 7 is a timing chart to explain an operation of a control circuit according to a second exemplary structure of a first embodiment.

FIG. 7 is a timing chart to explain an operation of the control circuit 30*b* according to the second exemplary structure of the first embodiment.

As the first clock signal CLK starts transiting from a low level to a high level, the first fixed potential VDDH is applied to node B at that point in time and therefore the potential of the node A rises to the third fixed potential VDDL (S21). With the increased potential of the node A, inversion of the inverter 34*b* (transition from a high level to a low level) starts (S22).

An output of the inverter 34*b* turns on the second P-channel transistor P2 with the result that the potential of the node A rises to the first fixed potential VDDH (S23). At the same time, the output of the inverter 34*b* turns on the fifth P-channel transistor P5 and the potential of the node B drops to the third fixed potential VDDL (S24). The rise of the potential of the node A from the third fixed potential VDDL to the first fixed potential VDDH makes the inversion of the inverter 34*b* faster and ensures the inversion thereof (S25).

On the other hand, as the first clock CLK starts transiting from a high level to a low level, the second N-channel transistor N2 conducts and the potential at the node A drops (S26). Then the fourth P-channel transistor P4 starts delivering the current due to the drop in the potential at the node A, thus raising the potential at the node B from the third fixed potential VDDL to the first fixed potential VDDH (S28). At the same time, the inverter 34*b* starts inverting (from a low level to a high level) due to the drop in the potential at the node A (S27).

By employing the flip-flop circuit 100 according to first embodiment described as above, the flip-flop circuit 100 operates by low-amplitude clock signals, so that the power consumed by the entire LSI can be reduced. The activation circuit 20 is controlled by the use of the low-amplitude clock signal and a high-amplitude inverted clock signal, which is obtained by increasing the amplitude of this low-amplitude clock signal and inverting the clock signal having the increased amplitude. As a result, the second activation transistor M4 turns on, with larger current flowing when controlled by a high-amplitude inverted clock signal than when controlled by a low-amplitude clock signal. Hence, the time period required for the data stored in the data storage circuit 22 until then to be inverted based on the data inputted to the transistor pair 12 is reduced, so that the aforementioned clock window period can be made shorter. If the clock window period can be reduced, the time period, namely a hold period, required for a pre-stage circuit for setting the input data D in the latch circuit 10 can be made shorter. As a result, the operation of the entire circuit including the pre-stage circuit can be made faster.

In the conventional practice, in order to make the clock window period shorter when the activation circuit 20 is controlled by the use of the aforementioned low-amplitude clock signals, the size of the second activation transistor M4 has to be made larger. In view of this, the size of the second activation transistor M4 according to the first embodiment does not need to be made larger and therefore the clock window period can be made shorter while increase in circuit scale is being suppressed. Since the size of the second activation transistor M4 does not need to be made larger, increase in power consumed thereby can be suppressed.

To have the flip-flop circuit 100 achieve such an advantageous effect, the control circuit 30 having a level-shifter function and an inverter function must operate at high speed while it operates on low power consumption and occupies less area. The above-described first and second exemplary structures meet these conditions.

By employing the control circuit 30 according to the first embodiment, the transition of the second clock signal CLKb from a low level to a high level does not need to be done so fast while the transition of the second clock signal CLKb from a high level to a low level needs to be done at high speed. In the control circuit 30*a* according to the first exemplary structure, the first clock signal CLK is inputted to the gate terminal of the third P-channel transistor P3. This configuration enables higher speed of transition of the second clock signal CLKb falling to a low level, without enlarging the size (gate length) of the first P-channel transistor P1 and the size (gate width) of the first N-channel transistor N1 that constitute the inverter 34*a*. This configuration contributes to the reduced power consumption and the saving of circuit area.

In the control circuit 30*b* according to the second exemplary structure, the voltage of the node A is inputted to the gate terminal of the first N-channel transistor N1 that constitutes the inverter 34*b*. As a result, the falling transition of the second clock signal CLKb can be made more precipitous than that of the first exemplary structure.

Figure 8:
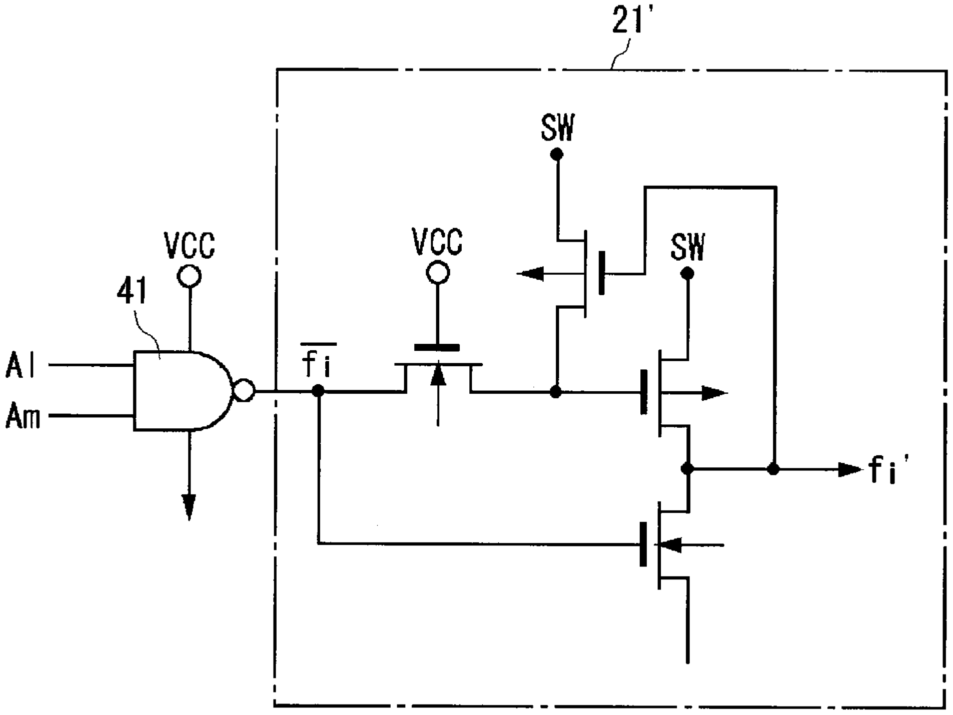
FIG. 8 shows a structure of a level shifter, according to a first comparative example, to be compared against a control circuit according to a first embodiment.

FIG. 8 shows a structure of a level shifter (Japanese Patent Application Laid-Open No. Sho61-34796, FIG. 2), according to a first comparative example, to be compared against the control circuit 30 according to the first embodiment.

Figure 9:
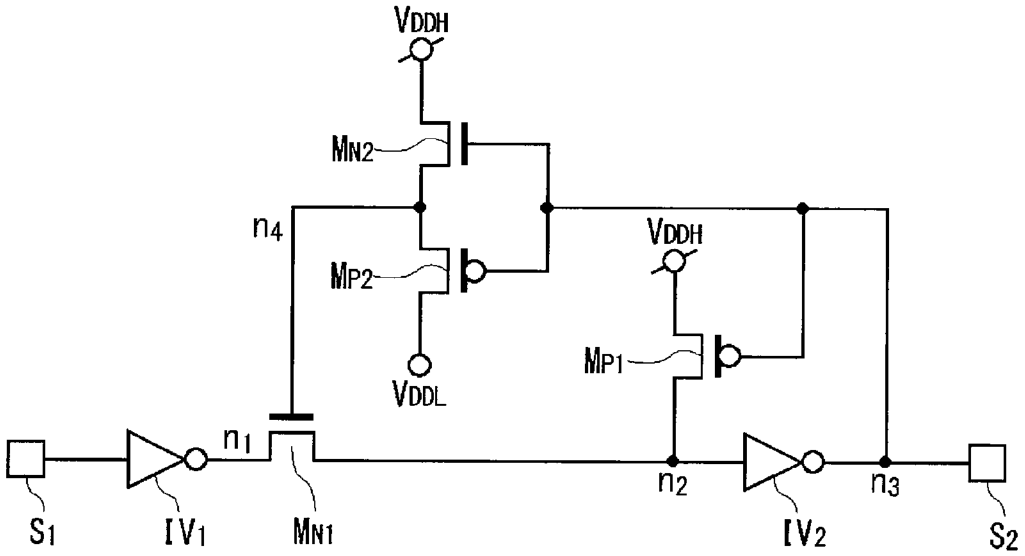
FIG. 9 shows a structure of a level shifter, according to a second comparative example, to be compared against a control circuit according to a first embodiment.

FIG. 9 shows a structure of a level shifter (Japanese Patent Application Laid-Open No. Hei09-64704, FIG. 1), according to a second comparative example, to be compared against the control circuit 30 according to the first embodiment.

The both level shifters work suitably when an input signal having an amplitude of a range between the power supply potential and the ground potential (such an amplitude will be hereinafter referred to as "normal amplitude") is to be converted to an output signal whose amplitude is larger than the normal amplitude. However, they do not function normally when, similarly in the first embodiment of the present invention, an input signal whose amplitude is smaller than the normal amplitude is to be converted into a normal amplitude output signal.

In the level shifter according to the first comparative example, the voltage inputted to the gate terminal of a P-channel transistor, which constitutes an inverter at an output stage, falls short. Thus, the inverter will not invert unless the P/N ratio of this inverter is drastically dropped. On the other hand, drastically dropping the P/N ratio requires a drastic increase in the size of the transistors.

In the level shifter according to the second comparative example, VDDL or VDDH is applied to the gate terminal of MN1. However, if VDDH is a normal power supply, (VDDH-Vth-Vth) which is applied to the node N2 will be smaller than Vth of an N-channel transistor that constitutes IV2 and therefore the output of IV2 will not be inverted.

Second Embodiment

Figure 10:
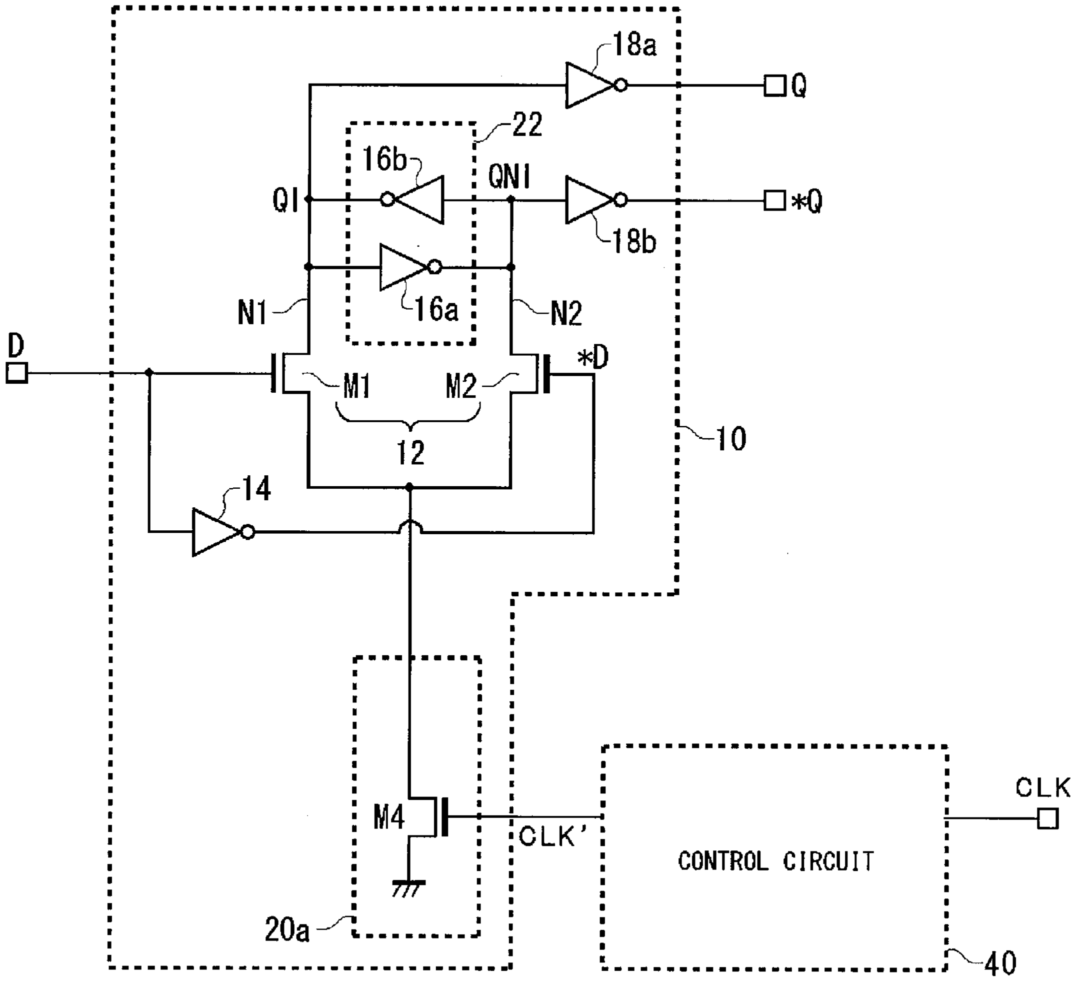
FIG. 10 is a circuit diagram showing a structure of a flip-flop circuit according to a second embodiment of the present invention.

FIG. 10 is a circuit diagram showing a structure of a flip-flop circuit 100*a* according to a second embodiment of the present invention.

As compared with the flip-flop circuit 100 according to the first embodiment, the flip-flop circuit 100*a* according to the second embodiment differs in that the configurations of activation circuit 20 and control circuit 30 differ from those of the first embodiment. Other structural components of the second embodiment are the same as those of the flip-flop circuit 100 according to the first embodiment.

In an activation circuit 20*a* of the flip-flop circuit 100*a* according to the second embodiment, the first activation transistor M3 is omitted as compared with the activation circuit 20 in the flip-flop circuit 100 according to the first embodiment. In other words, the activation of the transistor pair 12 is controlled by controlling the on and off of the second activation transistor M4 only.

Figure 11:
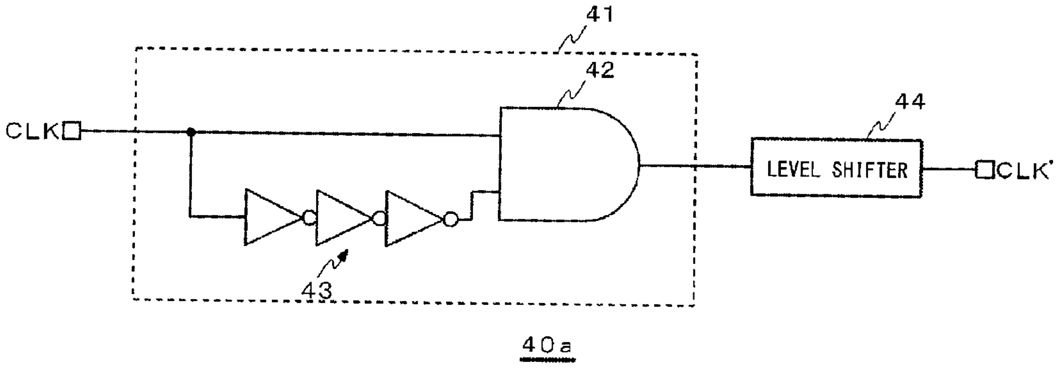
FIG. 11 shows a first exemplary structure of a control circuit according to a second embodiment of the present invention.

FIG. 11 shows a first exemplary structure of a control circuit 40*a* according to the second embodiment of the present invention.

The control circuit 40*a* according to the first exemplary structure according to the second embodiment includes a clock width adjusting circuit 41 and a level shifter 44. The clock width adjusting circuit 41 includes an AND circuit 42 and a delay inverting circuit 43. The delay inverting circuit 43 is structured such that an odd number of inverters (three stages in this example) are cascade-connected. One input terminal of the AND circuit 42 and an input terminal of the delay inverting circuit 43 receive a first clock signal CLK whose amplitude is smaller than that of input data D. An output terminal of the delay inverting circuit 43 is connected to the other input terminal of the AND circuit 42. The second power supply potential VDDL is the power supply for the AND circuit 42 and the delay inverting circuit 43.

When the first clock signal CLK is a low level, the clock width adjusting circuit 41 outputs a low level to the level shifter 44. This is because as the low level is inputted to one end of the AND circuit 42, the output of the AND circuit 42 is a low level. Note that the output of the delay circuit 43 is then a high level.

As the first clock signal CLK transits to a high level, the clock width adjusting circuit 41 outputs the high level to the level shifter 44 during a time period when the output of the delay inverting circuit 43 is a high level. This is because as high levels are inputted to both the input terminals of the AND circuit 42, the output of the AND circuit 42 goes high. As the output of the last-stage inverter of the delay inverting circuit 43 transits to a low level according to the first clock signal CLK (high level) inputted to the first-stage inverter thereof, the clock width adjusting circuit 41 outputs a low level to the level shifter 44.

In this manner, the clock width adjusting circuit 41 regulates the clock width between a rising edge and a falling edge of the first clock signal CLK. This clock width is determined by the delay time in the delay inverting circuit 43.

The level shifter 44 increases the amplitude of a low-amplitude first clock signal CLK (after the clock width has been regulated) outputted from the clock width adjusting circuit 41 so as to generate a full-amplitude third clock signal CLK'. That is, the range of a high-level-side fixed potential is made broader from the second power supply potential VDDL to the first power supply potential VDDH. The level shifter 44 has the thus generated third clock signal CLK' inputted to the gate terminal of the second activation transistor M4.

Figure 12:
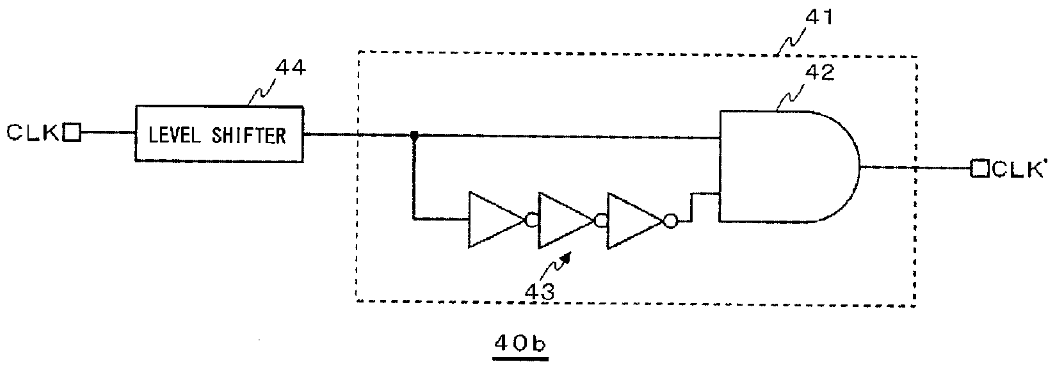
FIG. 12 shows a second exemplary structure of a control circuit according to a second embodiment of the present invention.

FIG. 12 shows a second exemplary structure of a control circuit 40*b* according to the second embodiment.

As compared with the control circuit 40*a* according to the first exemplary structure of the second embodiment, the control circuit 40*b* according to the second exemplary structure thereof is structured such that the order in which the clock width adjustment circuit 41 and the level shifter 44 are arranged is reversed. The first power supply potential VDDH is the power supply for the AND circuit 42 and the delay inverting circuit 43 according to the second exemplary structure. Similar to the control circuit 40*a* according to the first exemplary structure, the control circuit 40*b* according to the second exemplary structure can output the third clock signal CLK'.

Figure 13:
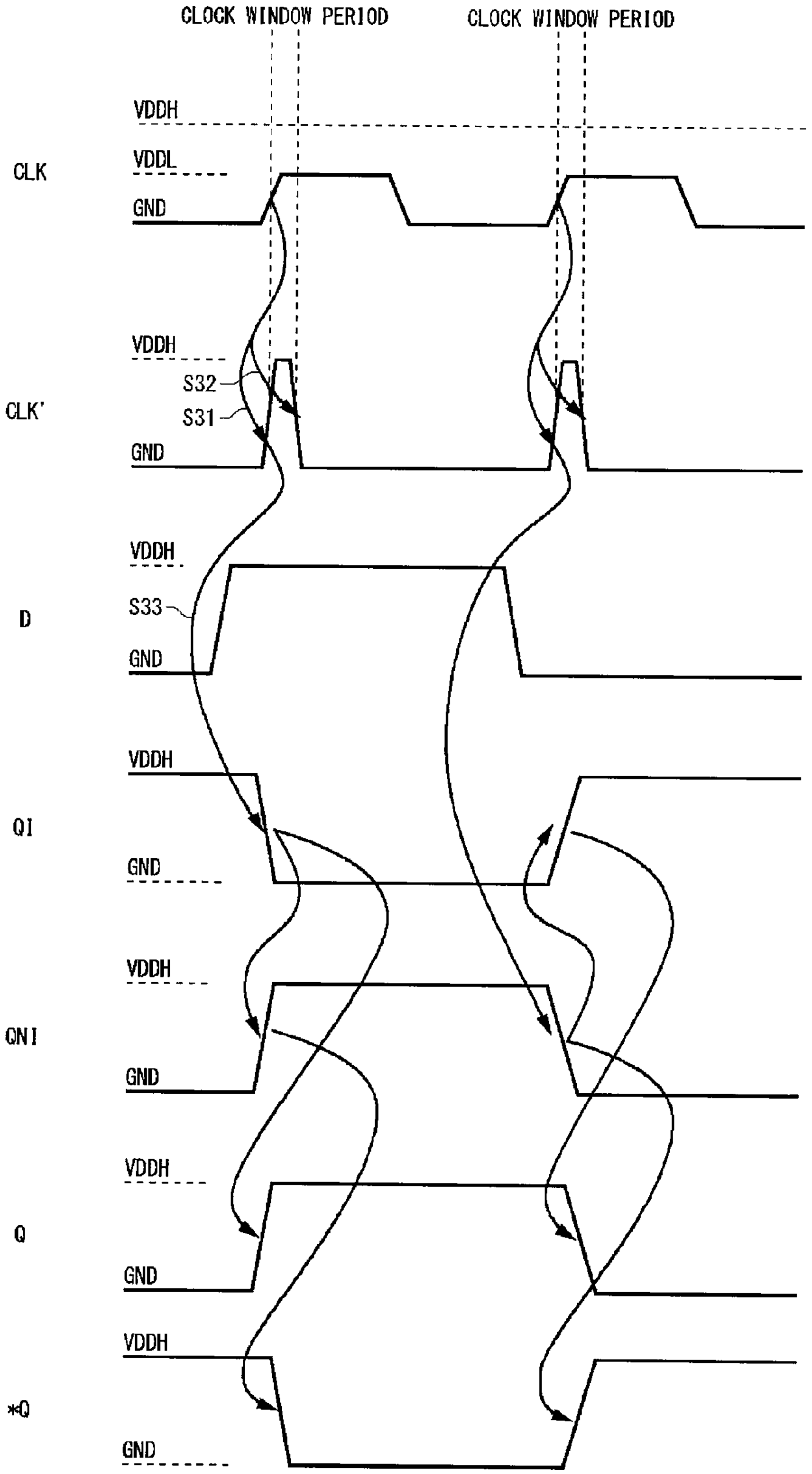
FIG. 13 is a timing chart to explain an operation of a flip-flop circuit according to a second embodiment of the present invention.

FIG. 13 is a timing chart to explain an operation of the flip-flop circuit 100*a* according to the second embodiment of the present invention.

This timing chart is similar to the timing chart of the flip-flop circuit 100, according to the first embodiment, shown in FIG. 3 with the second clock signal CLKb replaced by the third clock signal CLK'.

A rising edge and a falling edge of the third clock signal CLK' are generated by a rising edge of the first clock signal CLK (S31, S32). As the third clock signal CLK' exceeds a threshold voltage of the second activation transistor M4 during the time when the third clock signal CLK' inputted to the gate terminal of the second activation transistor M4 rises from a low level to a high level, the current will start flowing through the second activation transistor M4. As a result, the transistor pair 12 is activated and the internal data QI is inverted (S33). The other operations are the same as those shown in the timing chart of FIG. 3.

As described above, the same advantageous effects as those of the flip-flop circuit 100 according to the first embodiment are also achieved by the flip-flop circuit 100*a* according to the second embodiment. Although in the second embodiment the clock width adjusting circuit 41 needs to be provided within the control circuit 40, the provision of the first activation transistor M3 (in first embodiment) within the activation circuit 20 can be omitted in the second embodiment.

The present invention has been described based upon illustrative embodiments. These embodiments are intended to be illustrative only and it will be obvious to those skilled in the art that various other modifications to the combination of constituting elements and processes could be developed and that such modifications are also within the scope of the present invention.

The potentials of the first fixed potential, the second fixed potential and the third fixed potential are not limited to the aforementioned examples and may be arbitrarily set by a designer.

Also, it is possible to modify the structure of the latch circuit 10 in various ways. For example, an inverted set signal *S may be inputted in addition to the input data D. In such a case, a NAND circuit may be provided in place of the first internal inverter 16*a* and the inverted set signal *S may be inputted to one of input terminals of the NAND circuit. Also, an inverted reset signal *R may be inputted in addition to the inputted data D. In such a case, a NAND circuit may be provided in place of the second internal inverter 16*b* and the inverted reset signal *R may be inputted to one of input terminals of the NAND circuit.

Instead of using the level shifter 44 according to the second embodiment, the control circuit 30*a* or 30*b* according to the first embodiment can be used. In such a case, in the control circuit 40*a* according to the first exemplary structure, a NAND circuit may be used, for example, in place of the AND circuit 42. In the control circuit 40*b* according to the second exemplary structure, an inverter may be provided between the control circuit 30*a* or 30*b* and the clock width adjusting circuit 41, for example.

While the exemplary embodiments of the present invention and their modifications have been described using specific terms, such description is for illustrative purposes only, and it is to be understood that changes and variations may still be further made without departing from the spirit or scope of the appended claims.

What is claimed is:

1. A flip-flop circuit operated by a first clock signal whose amplitude is smaller than that of input data, the circuit comprising:

a pair of transistors which receive the input data and reversed input data thereof, respectively, to latch the input data;

an activation circuit which activates said pair of transistors in a conduction state; and a control circuit which receives the first clock signal and sets said activation circuit to a conduction state for a predetermined time period starting from an edge timing of the received first clock signal, wherein said control circuit increases the amplitude of the first clock signal and sets said activation circuit in a conduction state by using a second clock signal which is the first clock signal with the increased amplitude, and said control circuit includes:

an inverter including a first P-channel transistor and a first N-channel transistor, which are cascade-connected to each other, that are provided between a first fixed potential corresponding to a high-level-side potential of the second clock signal and a second fixed potential corresponding to a low-level-side potential thereof; and a second P-channel transistor having a source terminal connected directly or indirectly to the first fixed potential, a gate terminal receiving an output of the inverter, and a drain terminal supplying voltage to a gate terminal of the first P-channel transistor.

2. A flip-flop circuit according to claim 1, said control circuit further including:

a third P-channel transistor provided between the first fixed potential and the inverter; and a second N-channel transistor having a gate terminal that receives a third fixed potential corresponding to a high-level-side potential of the first clock signal, the second N-channel transistor being provided between an input terminal, used to take in the first clock signal, and a gate terminal of the first P-channel transistor, wherein the first clock signal is inputted to gate terminals of the first N-channel transistor and the third P-channel transistor.

3. A flip-flop circuit according to claim 2, wherein said activation circuit includes a first activation transistor and a second activation transistor provided between a source terminal of said pair of transistors and a second fixed potential for supplying a low-level-side potential of the first clock signal and the second clock signal, the first activation transistor and the second activation transistor being connected in cascade, and wherein said control circuit performs control in a manner such that the amplitude of the first clock signal is increased and is inverted, the first activation transistor is turned on by inputting the first clock signal to a gate terminal of the first activation transistor, and thereafter the second activation transistor is turned on by inputting the second clock to a gate terminal of the second activation transistor.

4. A flip-flop circuit according to claim 2, wherein said control circuit increases the amplitude of the second clock signal to that of the input data.

5. A flip-flop circuit according to claim 1, said control circuit further including:

a second N-channel transistor provided between an input terminal, used to take in the first clock signal, and an input terminal of the inverter;

a fourth P-channel transistor having a source terminal that receives the first fixed potential directly or indirectly, a gate terminal that receives voltage of the drain terminal of the second P-channel transistor, and a drain terminal that supplies voltage to a gate terminal of the second N-channel transistor; and a fifth P-channel transistor having a source terminal that receives directly or indirectly a third fixed potential corresponding to a high-level-side potential of the first clock signal, a gate terminal that receives an output of the inverter, and a drain terminal that supplies voltage to the gate terminal of the second N-channel transistor.

6. A flip-flop circuit according to claim 5, wherein said activation circuit includes a first activation transistor and a second activation transistor provided between a source terminal of said pair of transistors and a second fixed potential for supplying a low-level-side potential of the first clock signal and the second clock signal, the first activation transistor and the second activation transistor being connected in cascade, and wherein said control circuit performs control in a manner such that the amplitude of the first clock signal is increased and is inverted, the first activation transistor is turned on by inputting the first clock signal to a gate terminal of the first activation transistor, and thereafter the second activation transistor is turned on by inputting the second clock to a gate terminal of the second activation transistor.

7. A flip-flop circuit according to claim 5, wherein said control circuit increases the amplitude of the second clock signal to that of the input data.

8. A flip-flop circuit according to claim 1, wherein said activation circuit includes a first activation transistor and a second activation transistor provided between a source terminal of said pair of transistors and a second fixed potential for supplying a low-level-side potential of the first clock signal and the second clock signal, the first activation transistor and the second activation transistor being connected in cascade, and wherein said control circuit performs control in a manner such that the amplitude of the first clock signal is increased and is inverted, the first activation transistor is turned on by inputting the first clock signal to a gate terminal of the first activation transistor, and thereafter the second activation transistor is turned on by inputting the second clock to a gate terminal of the second activation transistor.

9. A flip-flop circuit according to claim 1, wherein said control circuit increases the amplitude of the second clock signal to that of the input data.

* * * * *